United States Patent
Farr et al.

(10) Patent No.: US 9,525,276 B2
(45) Date of Patent: Dec. 20, 2016

(54) ARC FAULT PATH FOR MITIGATION OF ARC FAULT IN POWER SUPPLY ENCLOSURE

(71) Applicants: Jeffrey S. Farr, Sewickley, PA (US); Kevin D. Wissner, Monroeville, PA (US); Edward A. Novack, New Kensington, PA (US); Graham M. Thompson, Pittsburgh, PA (US)

(72) Inventors: Jeffrey S. Farr, Sewickley, PA (US); Kevin D. Wissner, Monroeville, PA (US); Edward A. Novack, New Kensington, PA (US); Graham M. Thompson, Pittsburgh, PA (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 93 days.

(21) Appl. No.: 14/440,810

(22) PCT Filed: Nov. 6, 2013

(86) PCT No.: PCT/US2013/068673
§ 371 (c)(1),
(2) Date: May 5, 2015

(87) PCT Pub. No.: WO2014/074570
PCT Pub. Date: May 15, 2014

(65) Prior Publication Data
US 2015/0303661 A1    Oct. 22, 2015

Related U.S. Application Data

(60) Provisional application No. 61/722,974, filed on Nov. 6, 2012.

(51) Int. Cl.
*H05K 7/20* (2006.01)
*H02B 1/56* (2006.01)
(Continued)

(52) U.S. Cl.
CPC ............... *H02B 1/56* (2013.01); *H01H 33/53* (2013.01); *H01H 33/64* (2013.01); *H02B 13/025* (2013.01);
(Continued)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
(Continued)

(56) References Cited

U.S. PATENT DOCUMENTS 5,574,624 A     11/1996  Rennie et al.
5,625,545 A *   4/1997   Hammond ............ H02M 3/285
                                                       363/65
(Continued)

*Primary Examiner* — Anthony Haughton
*Assistant Examiner* — Razmeen Gafur (57) ABSTRACT

An enclosure for a power supply is provided. An aspect includes a first compartment and a second compartment located adjacent to the first compartment. Another aspect includes an intermediate pressure relief flap located inside the enclosure in between the first compartment and the second compartment, and a top pressure relief flap located on an external surface of the second compartment. Another aspect includes the intermediate pressure relief flap and the top pressure relief flap configured to be closed in the absence of an arc fault in the enclosure, and the intermediate pressure relief flap and the top pressure relief flap configured to open based on the presence of the arc fault in the enclosure, such that plasma from the arc fault vents from the first compartment into the second compartment via the opened interme-
(Continued)

diate pressure relief flap and out of the second compartment via the opened top pressure relief flap.

20 Claims, 9 Drawing Sheets

(51) Int. Cl.
- *H02B 13/025* (2006.01)
- *H05K 7/14* (2006.01)
- *H01H 33/53* (2006.01)
- *H01H 33/64* (2006.01)
- *H01L 23/473* (2006.01)
- *H01H 33/56* (2006.01)

(52) U.S. Cl.
CPC ...... *H05K 7/1432* (2013.01); *H01H 2033/568* (2013.01)

(58) Field of Classification Search
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 5,892,195 A * | 4/1999 | Aufermann | H02B 13/025 218/157 |
| 2002/0186536 A1* | 12/2002 | Kimball | H05K 7/20009 361/707 |
| 2005/0108996 A1* | 5/2005 | Latham | B01D 46/0023 55/385.2 |
| 2005/0201056 A1* | 9/2005 | Lin | G06F 1/20 361/695 |
| 2006/0082973 A1* | 4/2006 | Egbert | H05K 7/20154 361/709 |
| 2006/0171115 A1* | 8/2006 | Cramer | H02M 7/003 361/695 |
| 2006/0176653 A1* | 8/2006 | Davidson | G06F 1/181 361/679.34 |
| 2008/0049393 A1* | 2/2008 | Coglitore | G06F 1/18 361/679.45 |
| 2008/0144277 A1* | 6/2008 | Suzuki | G06F 1/20 361/679.48 |
| 2009/0178425 A1* | 7/2009 | Tsuchiya | G06F 1/203 62/259.2 |
| 2009/0185346 A1* | 7/2009 | Cairo | H05K 7/20127 361/692 |
| 2009/0302458 A1* | 12/2009 | Kubo | H01L 23/3672 257/706 |
| 2010/0110631 A1* | 5/2010 | Fong | H05K 7/20909 361/695 |
| 2010/0295383 A1* | 11/2010 | Cummings | H01L 31/02021 307/151 |
| 2010/0328884 A1* | 12/2010 | Oyama | B23K 9/32 361/692 |
| 2011/0075360 A1* | 3/2011 | Tomioka | G06F 1/20 361/695 |
| 2011/0083992 A1* | 4/2011 | Stuhlsatz | H05K 7/20563 206/706 |
| 2011/0205705 A1* | 8/2011 | Graybill | H05K 7/20836 361/696 |
| 2011/0267765 A1* | 11/2011 | Fuchs | G06F 1/182 361/679.33 |
| 2011/0273844 A1* | 11/2011 | Rivera Hernandez | H05K 7/1471 361/692 |
| 2011/0277967 A1* | 11/2011 | Fried | F28D 15/0266 165/104.26 |

\* cited by examiner

FIG. 7

ARC FAULT PATH FOR MITIGATION OF ARC FAULT IN POWER SUPPLY ENCLOSURE

CROSS-REFERENCE TO RELATED APPLICATION

This Application is the U.S. National Stage of International Application No. PCT/US2013/068673 filed 6 Nov. 2013, and claims benefit thereof, the entire contents and substance of which is hereby incorporated by reference. The International Application claims benefit, under 35 U.S.C. §119(e), of U.S. Provisional Application No. 61/722,974, filed on 6 Nov. 2012, the entire contents and substance of which is hereby incorporated by reference.

BACKGROUND

Embodiments of the present invention relate generally to power supply enclosures, and more particularly to an arc fault path for mitigation of an arc fault in a power supply enclosure.

Power supplies configured to contain, redirect, mitigate and or control a flow of pressure and heat-energy between a first alternating current (AC) system and a second AC system are used in a variety of commercial and industrial applications. For example, a power supply is typically used in AC motor control and operation systems. Various power supplies convert energy from a first frequency and voltage to a second variable frequency; which may include direct current (DC) and or AC power of fixed or variable frequency. One way to implement such a power supply is a drive including one or more power cells, each power cell including multiple solid state converters with an intermediate direct current (DC) link. One exemplary system incorporating such power cells is discussed in U.S. Pat. No. 5,625,545 to Hammond (the '545 patent), the disclosure of which is hereby incorporated by reference in its entirety as if fully set forth herein.

Figure 1:
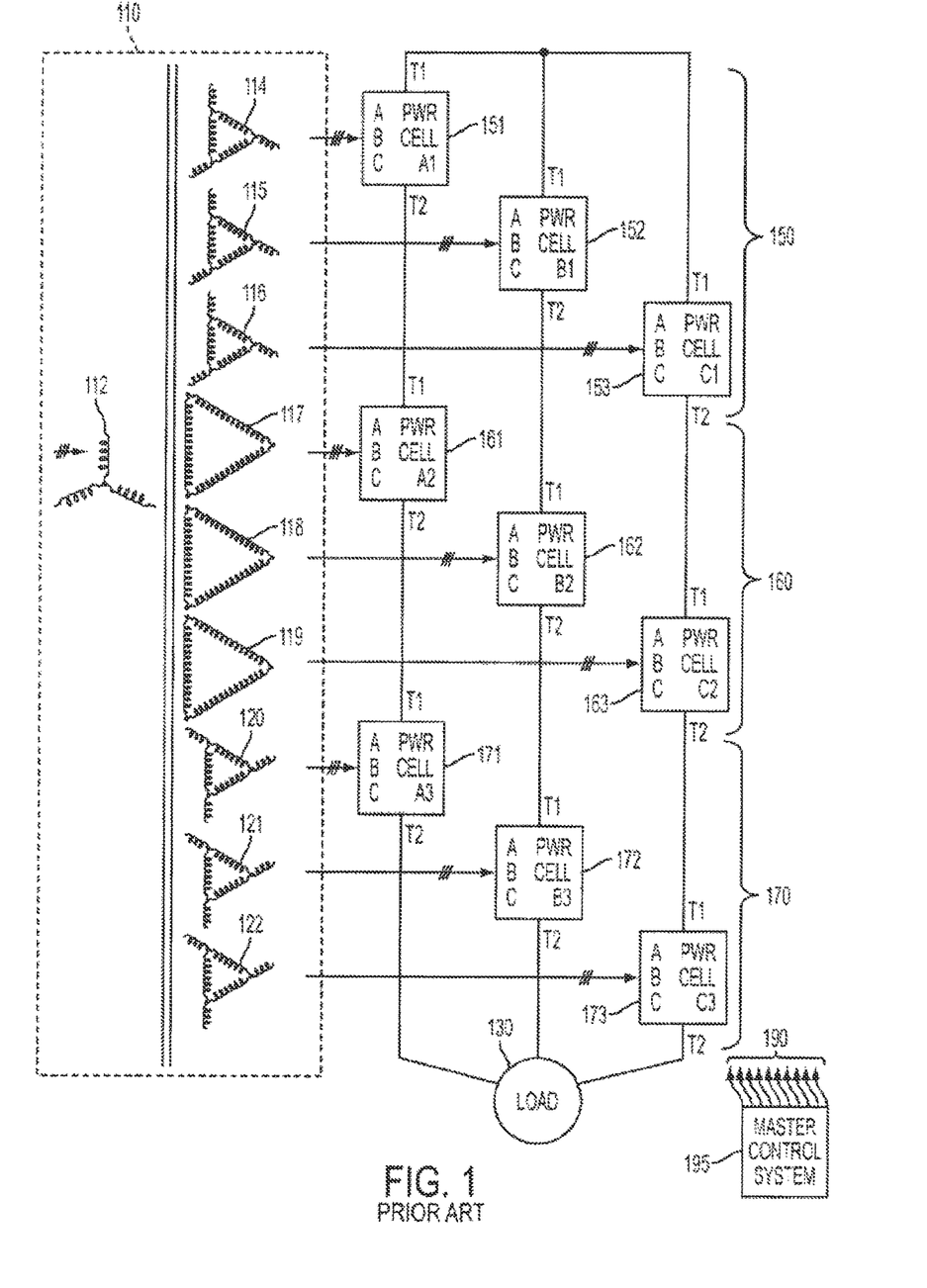
FIG. 1 illustrates an embodiment of a multi-cell power supply according to the prior art.

In certain applications, multi-cell power supplies utilize modular power cells to process power between a source and a load. Such modular power cells can be applied to a given power supply with various degrees of redundancy to improve the availability of the power supply. For example, FIG. 1 illustrates various embodiments of a prior art power supply (e.g., an AC motor drive) having nine such power cells. The power cells in FIG. 1 are represented by a block having input terminals A, B, and C; and output terminals T1 and T2. In FIG. 1, a transformer or other multi-winding device 110 receives three-phase, medium-voltage power at its primary winding 112, and delivers power to a load 130 such as a three-phase AC motor via an array of single-phase inverters (also referred to as power cells). Each phase of the power supply output is fed by a group of series-connected power cells, called herein a "phase-group".

The transformer 110 includes primary windings 112 that excite a number of secondary windings 114-122. Although primary winding 112 is illustrated as having a star configuration, a mesh configuration is also possible. Further, although secondary windings 114-122 are illustrated as having a delta or an extended-delta configuration, other configurations of windings may be used as described in the '545 patent. In the example of FIG. 1 there is a separate secondary winding for each power cell. However, the number of power cells and/or secondary windings illustrated in FIG. 1 is merely exemplary, and other numbers are possible. Additional details about such a power supply are disclosed in the '545 patent.

A number of ranks of power cells are connected between the transformer 110 and the load 130. A "rank" in the context of FIG. 1 is considered to be a three-phase set, or a group of three power cells established across each of the three phases of the power delivery system. Referring to FIG. 1, rank 150 includes power cells 151-153, rank 160 includes power cells 161-163, and rank 170 includes power cells 171-173. A master control system 195 sends command signals to local controls in each power cell over fiber optics or another wired or wireless communications medium 190. It should be noted that the number of power cells per phase depicted in FIG. 1 is exemplary, and more than or less than three ranks is possible in various embodiments.

A power supply such as is described in the '545 patent is housed in an enclosure. Arc faults may occur within such power supply enclosures; discussion of detection of arc faults in a power supply enclosure is found in U.S. Pat. No. 7,579,581 to Aiello et al., filed May 18, 2007, which is herein incorporated by reference in its entirety as if fully set forth herein.

SUMMARY

An enclosure for a power supply is provided. An aspect includes a first compartment and a second compartment located adjacent to the first compartment. Another aspect includes an arc fault path, comprising an intermediate pressure relief flap located inside the enclosure in between the first compartment and the second compartment, and a top pressure relief flap located on an external surface of the second compartment. Another aspect includes the intermediate pressure relief flap and the top pressure relief flap configured to be closed in the absence of an arc fault in the enclosure, and the intermediate pressure relief flap and the top pressure relief flap configured to open based on the presence of the arc fault in the enclosure, such that plasma from the arc fault vents from the first compartment into the second compartment via the opened intermediate pressure relief flap and out of the second compartment via the opened top pressure relief flap.

A method of venting an arc fault from an enclosure for a power supply via an arc fault path comprising an intermediate pressure relief flap and a top pressure relief flap is provided. An aspect includes, based on the arc fault, opening the intermediate pressure relief flap, the intermediate pressure relief flap being located inside of the enclosure in between a first compartment and a second compartment of the enclosure, the second compartment located adjacent to the first compartment. Another aspect includes venting plasma from the arc fault from the first compartment into the second compartment of the enclosure via the opened intermediate pressure relief flap. Another aspect includes opening the top pressure relief flap, the top pressure relief flap being located on an external surface of the second compartment, based on the venting of the plasma into the second compartment. Another aspect includes venting the plasma out of the second compartment via, the opened top pressure relief flap.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE DRAWINGS

Referring now to the drawings wherein like elements are numbered alike in the several FIGURES.

DETAILED DESCRIPTION

Embodiments of a power supply enclosure having an arc fault path for arc fault mitigation are provided, with exemplary embodiments being discussed below in detail. An internal short circuit in a power supply may result in an arc fault. Air is ionized between two or more potentials in the power supply by the arc fault, causing an arc flash comprising a plasma cloud of rapidly expanding vaporized metallic materials. The plasma causes high pressures and temperatures to build up quickly, in fractions of a second, within the power supply enclosure. The arc fault conditions must either be contained within the power supply enclosure or vented to the outside of the power supply enclosure. The cooling system of the power supply may include air intakes on the front, back, and/or sides of the power supply enclosure, and the plasma may escape the power supply enclosure through these air intakes. However, escaping of the plasma through the air intakes may result in danger to a user of the power supply, who may be located near the front, back, or sides of the power supply enclosure. In order to improve the safety of a user of a power supply during an arc fault, an internal arc fault path comprising intermediate and outer pressure relief flaps causes the plasma to vented out the top of the power supply enclosure (in some embodiments, at a height of 2 meters or greater; a required height may be specified by safety code requirements). The air intakes of the power supply may also be configured to block or reduce escaping of the plasma out of the enclosure through the air intakes while allowing cooling airflow to enter the power supply enclosure during normal operation.

Figure 2:
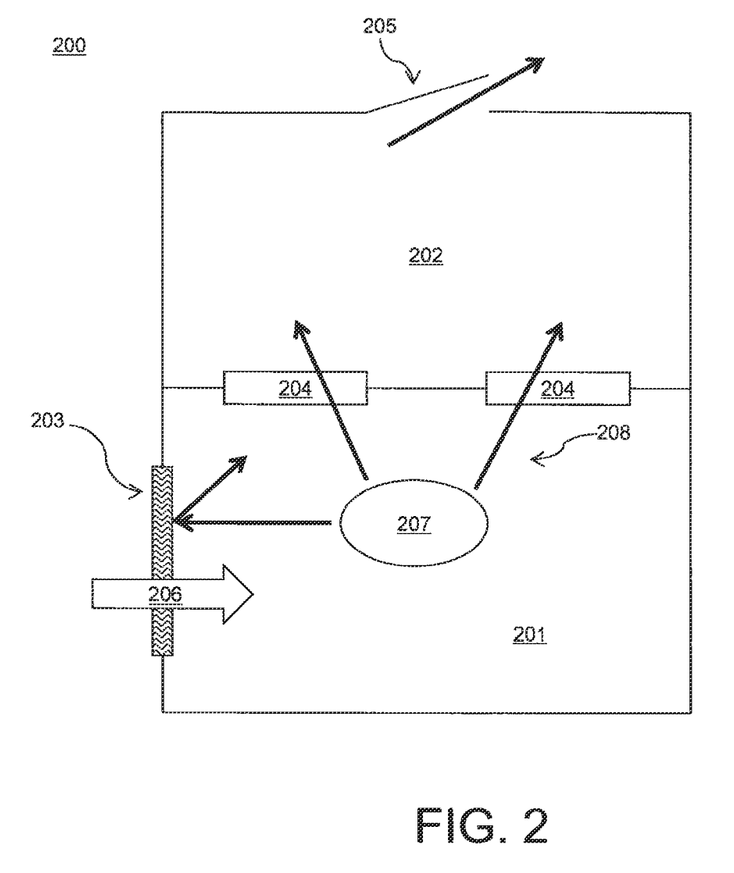
FIG. 2 is a block diagram illustrating an embodiment of a power supply enclosure having an arc fault path for arc fault mitigation.

FIG. 2 is a block diagram illustrating a cross-section of an embodiment of a power supply enclosure 200 having an arc fault path for arc fault mitigation. Power supply enclosure 200 may house a power supply such as is disclosed in the '545 patent. Power supply enclosure 200 comprises a first compartment 201 and an adjacent second compartment 202; many portions of the power supply may be located in the first compartment 201 or second compartment 202. First compartment 201 and second compartment 202 may comprise metal. The first compartment 201 comprises air intake louvers 203, which are located on an external surface of the power supply enclosure 200 and are part of the cooling system for the power supply enclosure 200. During normal operation of the power supply in the power supply enclosure 200, airflow 206 enters through air intake louvers 203 into the first compartment 201. (Air intake louvers 203 are discussed in further detail below with respect to FIG. 3.) The air intake louvers 203 have a higher pressure drop in the direction of the plasma 208 (i.e., from the inside to the outside of the power supply enclosure 200) as compared to the direction of the airflow 206, allowing airflow 206 to enter the power supply enclosure 200 via the air intake louvers 203 in order to cool the power supply, and reducing escaping of plasma 208 out of the air intake louvers 203 during an arc fault 207. The first compartment 201 further includes intermediate pressure relief flaps 204, which are part of the arc fault path, and are located internally to the power supply enclosure 200, in between first compartment 201 and second compartment 202. Intermediate pressure relief flaps 204 are discussed in further detail below with respect to FIGS. 4A-B. Second compartment 202 includes top pressure relief flap 205 that is located on an external surface of the power supply enclosure 200. Top pressure relief flap 205 is discussed in further detail below with respect to FIGS. 5A-B. When an arc fault 207 occurs in first compartment 201, plasma 208 from the arc fault 207 vents out of the first compartment 201 via intermediate pressure relief flaps 204 into second compartment 202, and then vents to the outside of power supply enclosure 200 through top pressure relief flap 205. In some embodiments, top pressure relief flap 205 may be located at a height of about two meters or greater during operation of the power supply, so as to avoid venting of plasma 208 towards a user of the power supply. The discharge height may be may be specified by safety code requirements.

FIG. 2 is shown for illustrative purposes only; for example, a power supply enclosure such as power supply enclosure 200 may include any appropriate number and configuration of air intake louvers, intermediate pressure relief flaps, and top pressure relief flaps. In various embodiments, there may be additional air intake louvers such as air intake louvers 203 located on any external surface of the power supply enclosure 200, such as the front, back, and/or sides of the first compartment 201 and/or the second compartment 202. In further embodiments in which the power supply in power supply enclosure 200 comprises a water-cooled power variable frequency drive, air intake louvers 203 may be omitted. Further, a first compartment 201 comprising intermediate pressure relief flaps 204 may be located in any appropriate location with respect to a second compartment 202 comprising a top pressure relief flap 205. For example, a first compartment 201 may be located underneath or next to a second compartment 202 in some embodiments. In some embodiments, the power supply enclosure 200 may include one or more additional first compartments that are similar to first compartment 201 and comprise respective intermediate pressure relief flaps 204. These additional first compartments may be located underneath and/or next to first compartment 201, second compartment 202, or one another, in various embodiments. Plasma 208 from an arc fault 207 may vent through any appropriate number of first compartments, via the respective intermediate pressure relief flaps 204, into a second compartment 202 and out the top pressure relief flap 205; an example of such a configuration is discussed below with respect to FIG. 7. Further, in some embodiments, multiple second compartments 202 comprising respective top pressure relief flaps 205 may be included in a power supply enclosure 200.

Various examples of enclosures that may be used in conjunction with a power supply such as is described in the '545 patent are discussed in U.S. patent application Ser. No. 13/535,655 (U.S. Patent Publication No. 2013/0003299; Wissner et al.) (the "Wissner application"), filed on Jun. 28, 2012, which is herein incorporated by reference in its entirety. Enclosures such as are described in the Wissner application may be modified to include air intake louvers such as air intake louvers 203, and an arc fault path including intermediate pressure relief flaps 204 and top pressure relief flap 205, as are shown in FIG. 2. In some embodiments, first compartment 201 may comprise a transformer compartment as described in the Wissner application, and second compartment 202 may comprise a power cell compartment as described in the Wissner application. In various embodiments, the power supply enclosure 200 may include any appropriate number of first and second compartments corresponding to any of a transformer compartment, a power cell compartment, a power input compartment, a power output compartment, a cooling compartment and/or a control compartment.

Figure 3:
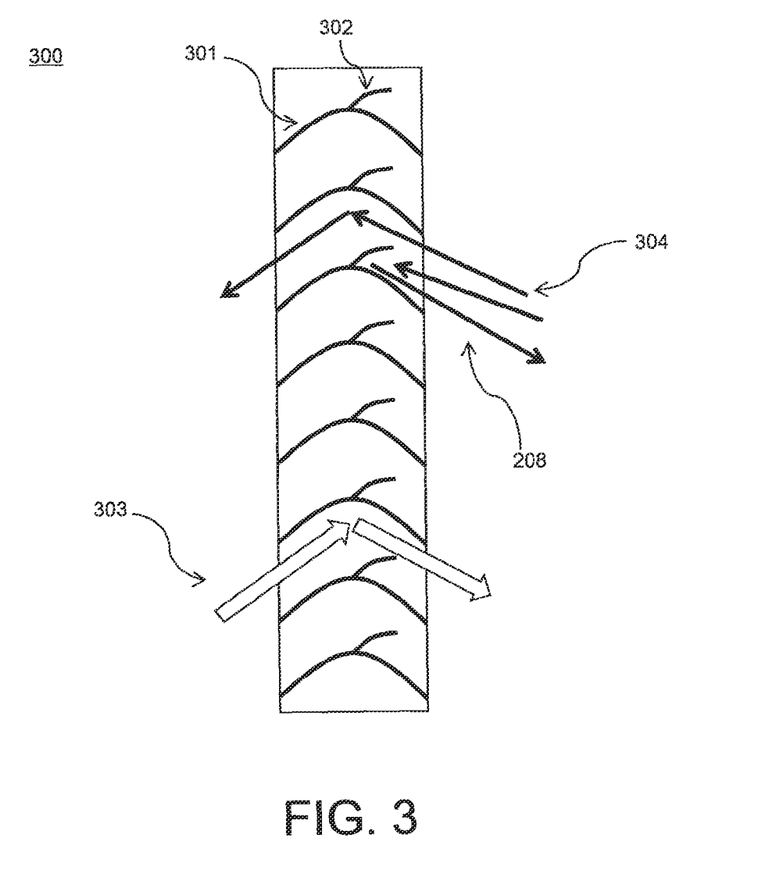
FIG. 3 illustrates an embodiment of air intake louvers for a power supply enclosure having an arc fault path.

FIG. 3 illustrates an embodiment of air intake louvers 300 for a power supply enclosure having an arc fault path. Air intake louvers 300 may comprise air intake louvers 203 of FIG. 2. Air intake louvers 300 do not provide line-of-sight access to the interior of the power supply enclosure, and are configured to allow sufficient airflow for cooling to enter the power supply enclosure 200 during normal operation while reducing escaping of plasma through the air intake louvers 300 in the event of an arc fault. Each air intake louver of air intake louvers 300 comprises a bottom member 301 and a top member 302 configured to allow airflow in one direction, as illustrated by airflow 303; this allows air to enter the power supply enclosure 200 for cooling purposes, corresponding to airflow 206 of FIG. 2. The air intake louvers 300 are further configured to reduce airflow in the other direction, as illustrated by element 304; this reduces the amount of plasma 208 from an arc fault 207 that escapes out of the air intake louvers 300. As shown in element 304 of FIG. 3, top member 302 causes a portion of the plasma 208 to be turned back instead of proceeding through the air intake louvers 300. Air intake louvers 300 are shown for illustrative purposes only; the air intake louvers 203 of FIG. 2 may comprise any appropriate air intake louvers that are configured to have a higher pressure drop in one direction. Further, air intake louvers such as air intake louvers 300 may be included on any appropriate external surface of the power supply enclosure 200, such as the front, back, and/or sides of a first compartment 201 and/or a second compartment 202, as are shown in FIG. 2.

Figure 4A:
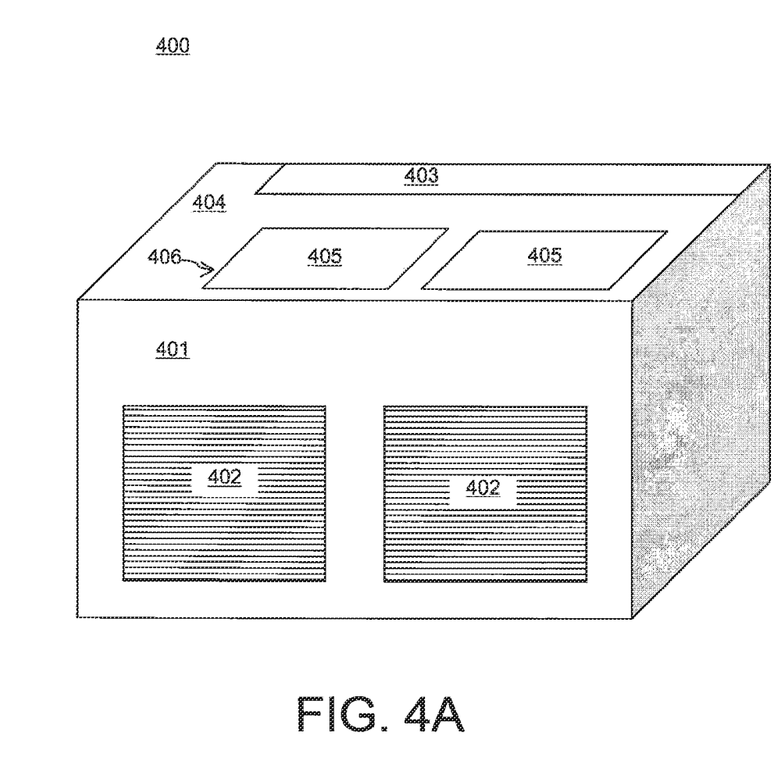
FIGS. 4A-B illustrate an embodiment of a first compartment, including intermediate pressure relief flaps, of a power supply enclosure having an arc fault path.
Figure 4B:
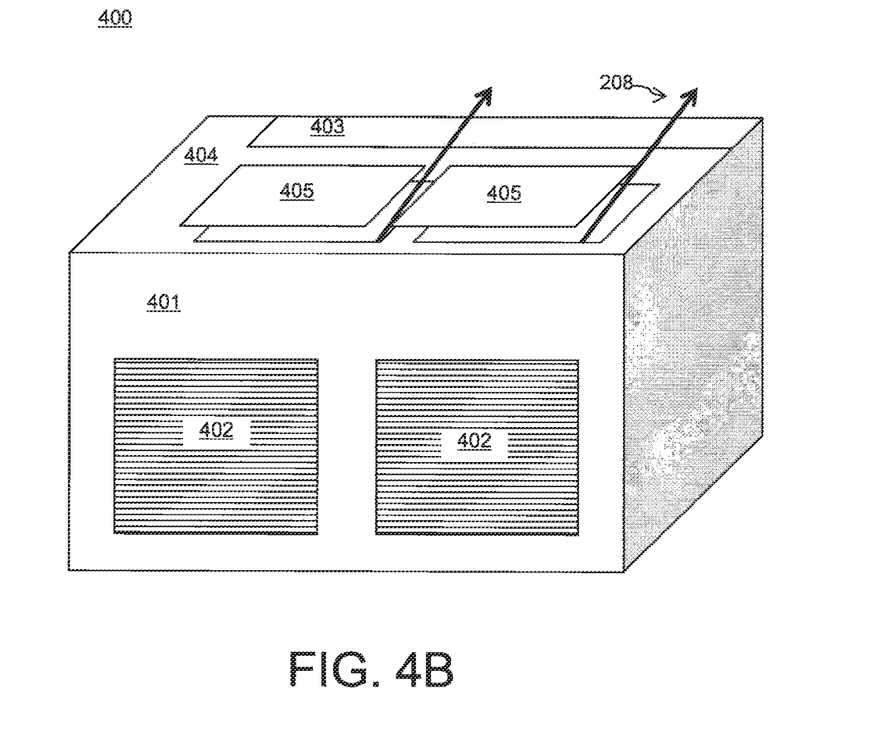

FIGS. 4A-B illustrate an embodiment of a first compartment 400, including air intake louvers 402 and intermediate pressure relief flaps 405, of a power supply enclosure having an arc fault path. FIG. 4A shows first compartment 400 during normal operation of the power supply in the absence of an arc fault, and FIG. 4B shows first compartment 400 during venting of plasma 208 from the first compartment 400 during an arc fault 207. First compartment 400 corresponds to first compartment 201 discussed above with respect to FIG. 2; air intake louvers 402 correspond to air intake louvers 203/300; and intermediate pressure relief flaps 405 correspond to intermediate pressure relief flaps 204. The air intake louvers 402 are located in external surface 401 of first compartment 400, and are configured to reduce escaping of plasma from an arc fault in first compartment 400 through the air intake louvers 402, as discussed above with respect to air intake louvers 300 of FIG. 3. As shown in FIG. 4A, the intermediate pressure relief flaps 405 are part of a flat panel 404 that is located on surface 403 of the first compartment 400. External surface 401 and surface 403 comprise metal, and panel 404 may comprise a non-metallic material. The panel 404 may comprise a composite material, such as, for example, Glastic™, in some embodiments. Panel 404 is internal to the power supply enclosure 200, and separates the first compartment 400 from another compartment (e.g., second compartment 202) of the power supply enclosure 200. During normal operation of the power supply, the panel 404 including intermediate pressure relief flaps 405 is a solid panel as shown in FIG. 4A. The edges 406 of the intermediate pressure relief flaps 405 are scored, or perforated, into the panel 404 in some embodiments. In other embodiments, the intermediate pressure relief flaps 405 are cut out of the panel 404, and held in place during normal operation of the power supply by, for example, gravity or a gasket located around the edges 406 of the intermediate pressure relief flaps 405.

As shown in FIG. 4B, in the event of an arc fault 207, pressure from the arc fault in the first compartment 400 causes the intermediate pressure relief flaps 405 in panel 404 to give way and allow the plasma 208 to vent out of the first compartment 400 and into another compartment of the power supply enclosure 200 (for example, another first compartment such as first compartment 201, or a second compartment 202) through the intermediate pressure relief flaps 405.

FIGS. 4A-B are shown for illustrative purposes only for example, a first compartment of a power supply enclosure may include any appropriate number and configuration of intermediate pressure relief flaps or air intake louvers, and a panel such as panel 404 may have any appropriate shape. A panel 404 including intermediate pressure relief flaps 405 may be located on the bottom, sides, and/or top of the first compartment 400, as appropriate for the configuration of the power supply enclosure 200 that includes the first compartment 400. Further, in some embodiments, a panel 404 including intermediate pressure relief flaps 405 may be located internally to a single compartment of the power supply enclosure.

Figure 5A:
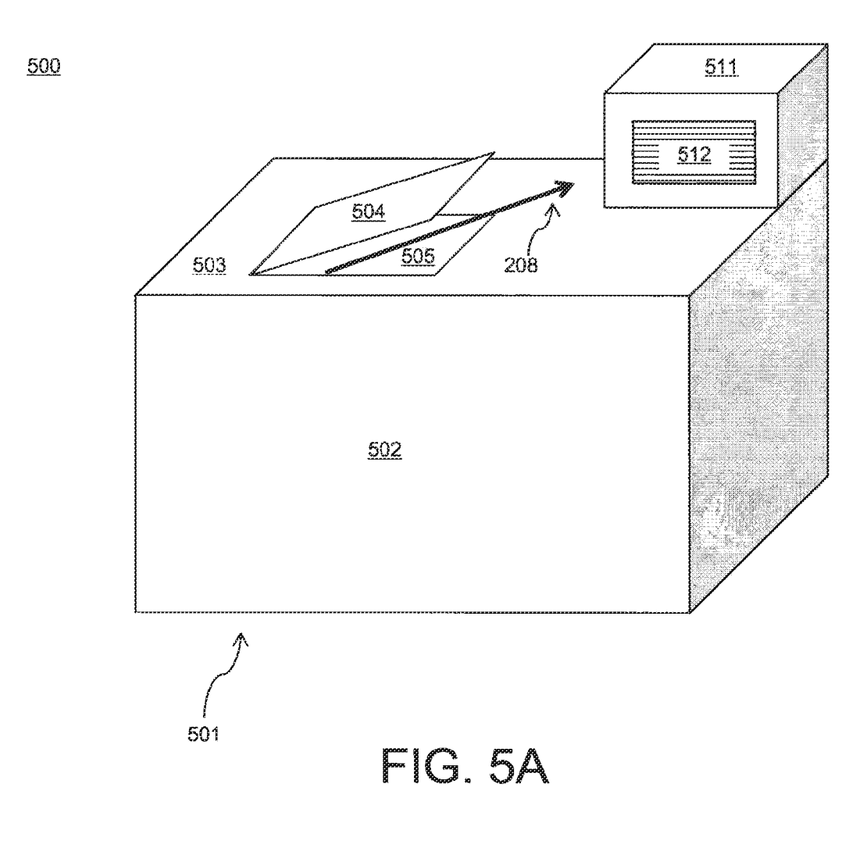
FIG. 5A illustrates an embodiment of a second compartment, including a top pressure relief flap, of a power supply enclosure having an arc fault path.

FIG. 5A illustrates an embodiment of a second compartment 500, including a top pressure relief flap 504, of a power supply enclosure having an arc fault path. The second compartment 500 corresponds to second compartment 202 of FIG. 2, and is located on top of or next to a first compartment 201/400. Second compartment 500 includes a surface 501 that is internal to the power supply enclosure 200. In various embodiments, surface 501 may be open, or include one or more opening corresponding to intermediate pressure relief flaps 405. Second compartment 500 further includes external surface 502 and external surface 503, which comprise metal. Top pressure relief flap 504 is located in external surface 503, and may also comprise metal. During normal operation, the top pressure relief flap 504 is closed (shown below with respect to side view 508 of FIG. 5B). Top pressure relief flap 504 may, in various embodiments, be cut, scored, or perforated in external surface 503, and, in some embodiments, be sealed by a gasket. In addition, the top pressure relief flap 504 may be hinged or have a seam in various embodiments; the seam may be bolted, welded, riveted or crimped. During an arc fault 207 in a first compartment 201, plasma 208 from the arc fault 207 vents into the second compartment 500 from the first compartment 201 via the intermediate pressure relief flaps 204, causing pressure to build up in the second compartment 500. This pressure causes the top pressure relief flap 504 to open, as shown as FIG. 5A, and allows the plasma 208 to vent out of second compartment 500 through opening 505. In some embodiments, top pressure relief flap 504 may be located at a height of 2 meters or greater during operation of the power supply, so as to avoid venting of plasma 208 towards a user of the power supply. An optional blower assembly 511 that is part of the cooling system of the power supply enclosure 200 may be located on external surface 503 of second compartment 500 as shown in FIG. 5A; during normal operation, hot air vents out of the power supply enclosure 200 via exhaust output 512 in blower assembly 511.

FIG. 5A is shown for illustrative purposes only for example, a second compartment 500 of a power supply enclosure 200 may include any appropriate number and configuration of top pressure relief flaps 504. In some embodiments, second compartment 500 may be adjacent to multiple first compartments such as first compartment 400 of FIGS. 4A-B; in such embodiments, a panel such as panel 404 including intermediate pressure relief flaps 405 is located between the second compartment 500 and each of the adjacent first compartments. Further, in some embodiments, second compartment 500 may include air intake louvers, such as air intake louvers 300 of FIG. 3, in any external surface of second compartment 500.

Figure 5B:
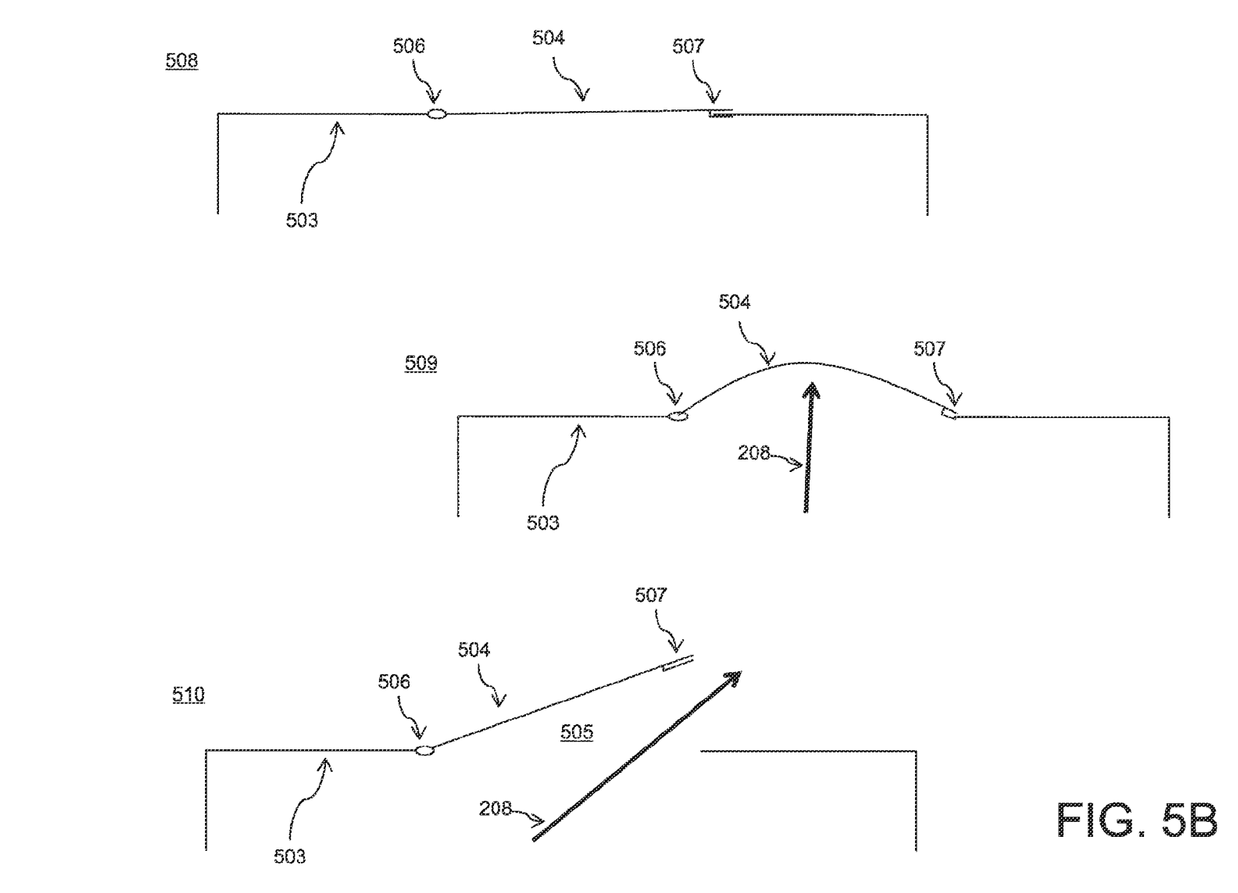
FIG. 5B illustrates side views an embodiment of a top pressure relief flap.

FIG. 5B shows side views 508, 509, and 510 of an example of a top pressure relief flap 504. Side view 508 shows a closed top pressure relief flap 504 during normal operation. The top pressure relief flap 504 includes a connection 506 and a latch 507, which engages with external surface 503 to seal the second compartment 500 closed. Connection 506 may comprise a nylon bolt, or a welded, riveted or crimped seam, in various embodiments. Side views 509 and 510 show the opening of the top pressure relief flap 504 during an arc fault 207. As shown in side view 509, the pressure from the plasma 208 from the arc fault 207 causes the top pressure relief flap 504 to bend, reducing the length of the top pressure relief flap 504 and releasing latch 507 from external surface 503. This causes the top pressure relief flap 504 to bend at connection 506, forming opening 505 through which the plasma vents out of the second compartment 500, as shown in side view 510. FIG. 5B is shown for illustrative purposes only a top pressure relief flap may be secured to the top surface of the second compartment in any appropriate manner.

Figure 6:
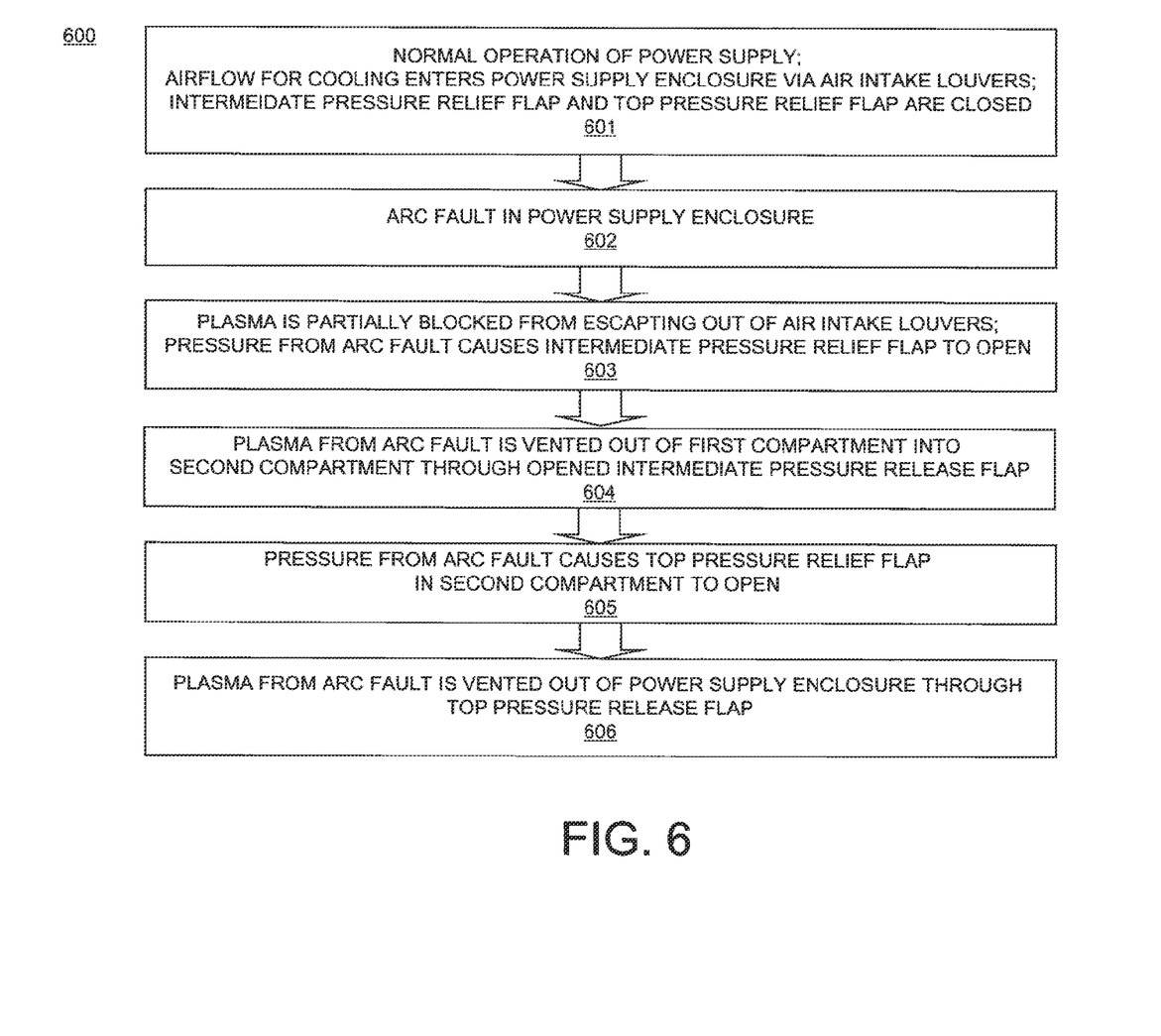
FIG. 6 illustrates a flowchart of a method for mitigating an arc fault in a power supply enclosure having an arc fault path.

FIG. 6 illustrates an embodiment of a method 600 of venting an arc fault in a power supply enclosure having an arc fault path. FIG. 6 is discussed with respect to FIGS. 2-5B. First in block 601, during normal operation of the power supply in power supply enclosure 200, airflow 206 enters the power supply enclosure 200 via the air intake louvers 203/300 for cooling of the power supply. The intermediate pressure relief flaps 204/405 and top pressure relief flap 205/504 are closed during the normal operation of block 601. Then, in block 602, an arc fault 207 occurs in the first compartment 201 of the power supply enclosure 200, emitting plasma 208. In block 603, the plasma 208 from the arc fault 207 is partially prevented from escaping out of the power supply enclosure 200 via the air intake louvers 203/300 (for example, as illustrated by element 304 of FIG. 3), and the pressure from the arc fault 207 builds in the first compartment 201, causing the intermediate pressure relief flaps 204/405 to open. The intermediate pressure relief flaps 204/405 may comprise scored or perforated areas in a panel 404, or, in other embodiments, the intermediate pressure relief flaps 204/405 are cut out of the panel 404, and held in place during normal operation of the power supply by, for example, gravity, a gasket, partially cut seam(s), or other hardware. Panel 404 comprises a portion of a surface 403 of the first compartment 201/400, and is located internally to the power supply enclosure 200. Panel 404 and intermediate pressure relief flaps 405 may comprise a composite material in some embodiments. Next, in block 604, the plasma 208 is vented out of the first compartment 201/400 via, opened intermediate pressure relief flaps 204/405 into the second compartment 202/500. Then, in block 605, pressure from the arc fault 207 builds in the second compartment 202/500, causing the top pressure relief flap 205/504 to open. In some embodiments, the pressure from arc fault 207 may cause the top pressure relief flap 504 to bend, causing latch 507 to release as shown in FIG. 5B. Lastly, in block 606, the plasma 208 is vented from the second compartment 202/500 via the opened top pressure relief flap 205/504.

Figure 7:
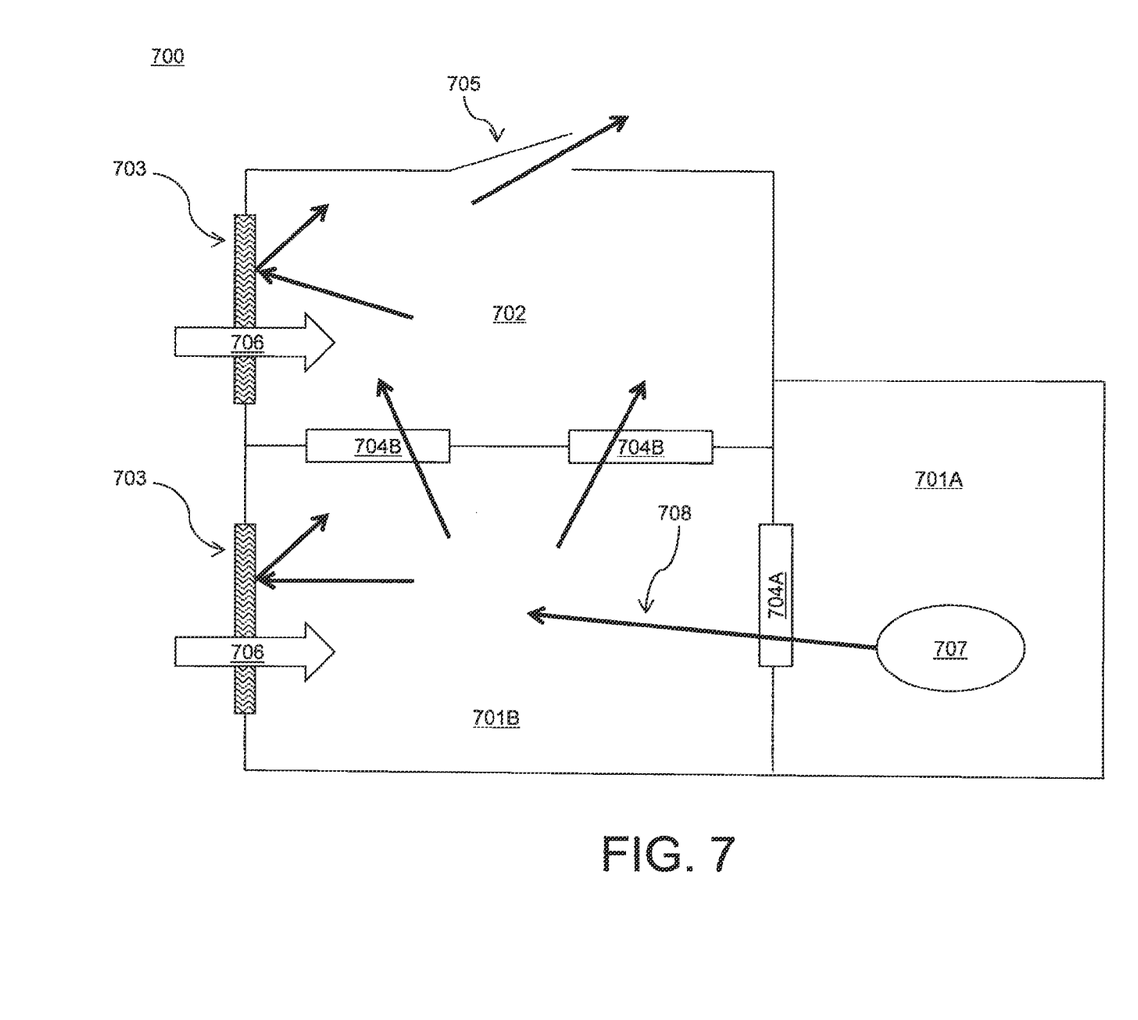
FIG. 7 is a block diagram illustrating another embodiment of a power supply enclosure having an arc fault path for arc fault mitigation.

FIG. 7 is a block diagram illustrating a cross-section of another embodiment of a power supply enclosure 700 having an arc fault path for arc fault mitigation. Power supply enclosure 700 comprises adjacent first compartments 701A-B, which correspond to first compartment 201/400, and a second compartment 702, which corresponds to second compartment 202/500 and is adjacent to first compartment 701B. Any appropriate portions of the power supply may be located in the first compartments 701A-B or second compartment 702. The first compartment 701B and second compartment 702 comprise air intake louvers 703 such as were discussed in above with respect to FIG. 3, which allow airflow 706 to enter the power supply enclosure 700 via the air intake louvers 703 in order to cool the power supply, and reduce escaping of plasma 708 out of the air intake louvers 703 during an arc fault 707. The first compartments 701A-B further include intermediate pressure relief flaps 704A-B, such as were discussed above with respect to FIGS. 4A-B, that are located internally to the power supply enclosure 700. Intermediate pressure relief flap 704A is located in between first compartment 701A and first compartment 701B, and intermediate pressure relief flaps 704B are located between first compartment 701B and second compartment 702. Second compartment 702 includes top pressure relief flap 705 such as was discussed above with respect to FIGS. 5A-B that is located on an external surface of the power supply enclosure 700. When an arc fault 707 occurs in first compartment 701A, plasma 708 from the arc fault 707 vents out of the first compartment 701A via intermediate pressure relief flap 704A into first compartment 701B, and then into second compartment 702 via intermediate pressure relief flaps 704B. The plasma 708 then vents to the outside of power supply enclosure 700 through top pressure relief flap 705. In some embodiments, top pressure relief flap 705 may be located at a height of 2 meters or greater during operation of the power supply, so as to avoid venting of plasma 708 towards a user of the power supply. FIG. 7 is shown for illustrative purposes only; a power supply enclosure may include any configuration of compartments joined by intermediate pressure relief flaps, and an arc fault such as arc fault 707 may occur in any compartment of a power supply enclosure.

The technical effects and benefits of exemplary embodiments include venting of plasma from an arc fault in a power supply to the top of the power supply enclosure, away from any users that may be located near the front, sides, or back the power supply enclosure.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An enclosure for a power supply, comprising:
a first compartment;
a second compartment located adjacent to the first compartment; and
an arc fault path, comprising:
an intermediate pressure relief flap located inside the enclosure in between the first compartment and the second compartment, and a top pressure relief flap located on an external surface of the second compartment;
the intermediate pressure relief flap and the top pressure relief flap configured to be closed in the absence of an arc fault in the enclosure, and the intermediate pressure relief flap and the top pressure relief flap configured to open based on the presence of the arc fault in the enclosure, such that plasma from the arc fault vents from the first compartment into the second compartment via the opened intermediate pressure relief flap and out of the second compartment via the opened top pressure relief flap.

2. The enclosure of claim 1, the first compartment comprising a first external surface, and a second surface that is located internally to the enclosure, the second surface comprising a panel, the panel comprising a material that is different from a material of the first external surface, and wherein the intermediate pressure relief flap is located in the panel and comprises the same material as the panel.

3. The enclosure of claim 2, wherein the first external surface comprises a metal, and the panel and the intermediate pressure relief flap comprise a composite material.

4. The enclosure of claim 2, wherein edges of the intermediate pressure relief flap are scored into the panel.

5. The enclosure of claim 2, wherein the intermediate pressure relief flap is cut out of the panel, and is held closed in the absence of the arc fault by one of gravity and a gasket.

6. The enclosure of claim 1, wherein the external surface of the second compartment and the top pressure relief flap comprise a metal.

7. The enclosure of claim 6, the top pressure relief flap further comprising a connection configured to attach the top pressure relief flap to the external surface of the second compartment, and a latch that is engaged with the external surface of the second compartment in the absence of the arc fault, wherein the top pressure relief flap is configured to bend in the presence of the arc fault, and wherein the latch is configured to disengage from the external surface of the second compartment based on the bending of the top pressure relief flap.

8. The enclosure of claim 1, the enclosure further comprising air intake louvers in an external surface of the enclosure, the air intake louvers configured allow airflow to enter the enclosure for cooling, and to block a portion of the plasma from the arc fault from escaping out of the enclosure via the air intake louvers.

9. The enclosure of claim 1, further comprising a third compartment located adjacent to the first compartment, and the arc fault path further comprising a second intermediate pressure relief flap located inside the enclosure in between the first compartment and the third compartment;
the second intermediate pressure relief flap configured to be closed in the absence of an arc fault in the enclosure, and the second intermediate pressure relief flap configured to open based on the presence of the arc fault in the enclosure, such that plasma from the arc fault vents from the third compartment into the first compartment via the opened second intermediate pressure relief flap.

10. The enclosure of claim 1, wherein the top pressure relief flap is located at a height of 2 meters or higher from a bottom surface of the enclosure.

11. A method of venting an arc fault from an enclosure for a power supply via an arc fault path comprising an intermediate pressure relief flap and a top pressure relief flap, comprising:
based on the arc fault, opening the intermediate pressure relief flap, the intermediate pressure relief flap being located inside of the enclosure in between a first compartment and a second compartment of the enclosure, the second compartment located adjacent to the first compartment;
venting plasma from the arc fault from the first compartment into the second compartment of the enclosure via the opened intermediate pressure relief flap;
opening the top pressure relief flap, the top pressure relief flap being located on an external surface of the second compartment, based on the venting of the plasma into the second compartment; and
venting the plasma out of the second compartment via the opened top pressure relief flap.

12. The method of claim 11, the first compartment comprising a first external surface, and a second surface that is located internally to the enclosure, the second surface comprising a panel, the panel comprising a material that is different from a material of the first external surface, and wherein the intermediate pressure relief flap is located in the panel and comprises the same material as the panel.

13. The method of claim 12, wherein the first external surface comprises a metal, and the panel and the intermediate pressure relief flap comprise a composite material.

14. The method of claim 12, wherein edges of the intermediate pressure relief flap are scored into the panel.

15. The method of claim 12, wherein the intermediate pressure relief flap is cut out of the panel, and is held closed in the absence of the arc fault by one of gravity and a gasket.

16. The method of claim 11, wherein the external surface of the second compartment and the top pressure relief flap comprise a metal.

17. The method of claim 16, the top pressure relief flap further comprising a connection configured to attach the top pressure relief flap to the external surface of the second compartment, and a latch that is engaged with the external surface of the second compartment in the absence of the arc fault, wherein the top pressure relief flap is configured to bend in the presence of the arc fault, and wherein the latch is configured to disengage front the external surface of the second compartment based on the bending of the top pressure relief flap.

18. The method of claim 11, the enclosure further comprising air intake louvers in an external surface of the enclosure, the air intake louvers configured allow airflow to enter the enclosure for cooling, and to block a portion of the plasma from the arc fault from escaping out of the enclosure via the air intake louvers.

19. The method of claim 11, the enclosure further comprising a third compartment located adjacent to the first compartment, and a second intermediate pressure relief flap located inside the enclosure in between the first compartment and the third compartment, the method further comprising:
based on the presence of an arc fault, opening the second intermediate pressure relief flap; and
venting plasma from the arc fault from the third compartment into the first compartment of the enclosure via the opened second intermediate pressure relief flap.

20. The method of claim 11, wherein the top pressure relief flap is located at a height of 2 meters or higher from a bottom surface of the enclosure.

* * * * *